(12) United States Patent
Kwon

(10) Patent No.: US 7,470,592 B2
(45) Date of Patent: Dec. 30, 2008

(54) METHOD OF MANUFACTURING A SONOS DEVICE

(75) Inventor: Sung-Woo Kwon, Anyang (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 213 days.

(21) Appl. No.: 11/314,317

(22) Filed: Dec. 22, 2005

(65) Prior Publication Data

US 2006/0145244 A1   Jul. 6, 2006

(30) Foreign Application Priority Data

Dec. 30, 2004   (KR) .................. 10-2004-0117148

(51) Int. Cl.
*H01L 21/336* (2006.01)
(52) U.S. Cl. .............. 438/287; 438/288; 257/324
(58) Field of Classification Search ............ None
See application file for complete search history.

(56) References Cited

U.S. PATENT DOCUMENTS

| 7,172,938 B2 * | 2/2007 | Choi et al. ............ 438/257 |
| 7,190,021 B2 * | 3/2007 | Kang ................. 257/316 |
| 7,345,336 B2 * | 3/2008 | Jeon et al. ............ 257/324 |
| 2005/0133849 A1 * | 6/2005 | Jeon et al. ............ 257/314 |

\* cited by examiner

*Primary Examiner*—Zandra Smith
*Assistant Examiner*—Khanh B Duong
(74) *Attorney, Agent, or Firm*—McKenna Long & Aldridge LLP

(57) ABSTRACT

A SONOS device and a method of manufacturing the same is provided. A tunnel dielectric layer, a charge trap layer, and a charge blocking layer are formed on a semiconductor substrate, and the charge blocking layer is formed on the charge trap layer such that the charge blocking layer is relatively thicker at regions adjacent to or overlapping the source and the drain and relatively thinner at a region overlapping the channel region. A gate is then formed on the blocking layer.

3 Claims, 3 Drawing Sheets

METHOD OF MANUFACTURING A SONOS DEVICE

CROSS-REFERENCE TO RELATED APPLICATION

This application claims priority to and the benefit of Korean Patent Application No. 10-2004-0117148 filed in the Korean Intellectual Property Office on Dec. 30, 2004, the entire contents of which are incorporated herein by reference.

BACKGROUND OF THE INVENTION

1. Field of the Invention

The present invention relates to a semiconductor device. More particularly, the present invention relates to a Silicon-Oxide-Nitride-Oxide-Silicon (SONOS) device in which protection from rupture of an Oxide-Nitride-Oxide (ONO) layer with a charge trap layer is enhanced, and a method of manufacturing the same.

2. Description of the Related Art

SONOS devices are considered to be very important as non-volatile memory devices. However, one significant problem with this type of devices is that for write and erase operations they require application of a high voltage that may ultimately destroy the ONO layer with the charge trap layer.

FIG. 1 is a cross-sectional view of a conventional SONOS device.

Referring to FIG. 1, in a conventional SONOS device an ONO structure 20 is formed on a silicon substrate 10. The ONO structure 20 includes a tunnel oxide layer 21, a silicon nitride layer 23, and a silicon oxide layer 25 for charge blocking. A conductive polysilicon layer is deposited on the ONO structure 20 to form a gate electrode 30. A source 41 and a drain 45 are formed on the substrate 10 adjacent to the gate electrode 30, thereby completing a transistor structure.

When a positive (+) voltage is applied to the gate electrode 30, electrons are transferred to the silicon surface. If a higher voltage is applied to the gate electrode 30, some of the electrons obtain sufficient energy and they move through the tunnel oxide layer 21 by FN tunneling. The electrons that move through the tunnel oxide layer 21 are trapped in the nitride layer 23 in the ONO structure 20. Therefore, during a write operation, negative charges 27 are trapped in the silicon nitride layer 23.

Because of the electrons trapped in the nitride layer 23, as the application of the high voltage to the gate electrode 30 continues, the voltage measurement increases to the transistor threshold voltage (Vth) causing the transistor to turn off, thereby terminating the program operation. In an attempt to improve such a program characteristic, prior art techniques have tried to form the ONO layer to be extremely thin such that the amount of electrons undergoing FN tunneling may be increased. A thin ONO structure 20, however, is easily ruptured at a high voltage. Furthermore, changing of the nitride layer characteristic has also been tried for improving the program characteristic.

Additionally, while during the program operation, the electrons in the region where the source 41 and the drain 45 overlap with the gate electrode 30 are transferred to the nitride layer 23, during an erase operation, such electrons may not easily escape to the channel region. This causes the overlap region to become unnecessarily charged with electrons. In turn, this phenomenon may cause the ONO layer 20 to be destroyed due to continual degradation of the ONO layer 20 by program-erase stress.

SUMMARY OF THE INVENTION

The present invention provides a SONOS device and method of manufacturing the same that substantially obviates one or more of the problems due to limitations and disadvantages of the related art.

One advantage of the present invention is that it can prevent rupture of an ONO structure used as a charge trap layer.

An exemplary SONOS device according to an embodiment of the present invention includes: a source and a drain formed with a channel therebetween on a semiconductor substrate; a tunnel dielectric layer formed on the semiconductor substrate; a charge trap layer formed on the tunnel dielectric layer; a charge blocking layer formed on the charge trap layer such that the charge blocking layer is relatively thicker at regions adjacent to or overlapping the source and the drain and is relatively thinner at a region overlapping the channel between the relatively thicker regions; and a gate formed on the charge blocking layer.

The tunnel dielectric layer may include a silicon oxide layer, the charge trap layer may include a silicon nitride layer, and the charge blocking layer may include a silicon oxide layer.

An exemplary method of manufacturing a SONOS device according to an embodiment of the present invention includes: forming a tunnel dielectric layer on a semiconductor substrate; forming a charge trap layer on the tunnel dielectric layer; forming a charge blocking layer on the charge trap layer such that the charge blocking layer is relatively thicker at regions adjacent to or overlapping source and drain regions and is relatively thinner at a region overlapping a channel region between the source and drain regions; and forming a gate on the charge blocking layer.

Formation of the charge blocking layer may include: forming a first charge blocking layer on the charge trap layer; selectively etching a region of the first charge blocking layer overlapping the channel; forming a second charge blocking layer on the etched first charge blocking layer, the second blocking layer having locally thicker regions where the steps are formed by the etching of the first charge blocking layer; and patterning the second charge blocking layer such that the locally thicker regions may be adjacent to or overlap the source and the drain.

Selectively etching the first charge blocking layer may include: forming a mask exposing the region of the first charge blocking layer overlapping the channel; and selectively etching the first charge blocking layer exposed by the mask, such that the lower charge trap layer is exposed.

Selectively etching the first charge blocking layer may be performed by removing the exposed region of the first charge blocking layer using the mask such that the lower charge trap layer is exposed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principle of the invention.

In the drawings.

DETAILED DESCRIPTION OF THE EMBODIMENTS

Reference will now be made in detail to an exemplary embodiment of the present invention, examples of which are illustrated in the accompanying drawings.

In an exemplary embodiment of the present invention, a method for locally thickening the region of an ONO structure in which a gate is overlapped with a source and a drain is provided. In this exemplary embodiment, rupture characteristics of the ONO structure may be improved.

According to an embodiment of the present invention, an ONO layer is deposited, and then a part of a region of the uppermost oxide layer is removed. Another oxide layer is then separately deposited thereon to form an uppermost oxide layer. Therefore, the thickness of the portion of the ONO structure overlapping with the channel region can remain the same as in a conventional device; however, the thickness of the portion of the ONO structure overlapping or adjacent to the source and the drain is relatively larger.

When the SONOS transistor performs an erase operation by applying a negative voltage to the gate electrode, the amount of undesired electrons which move from the gate electrode to the nitride layer through the uppermost oxide layer by back-tunneling steeply decreases in the portions where the locally thicker regions of the ONO structure overlaps or is adjacent to the source and the drain. Accordingly, the amount of electrons accumulated in the locally thicker regions substantially decreases. Therefore, rupture of the ONO layer can be suppressed very effectively when the write and erase operations are performed repeatedly.

FIG. 2 to FIG. 5 show cross-sectional views of a SONOS device showing sequential stages of a method of manufacturing the same according to an exemplary embodiment of the present invention.

Figure 1:
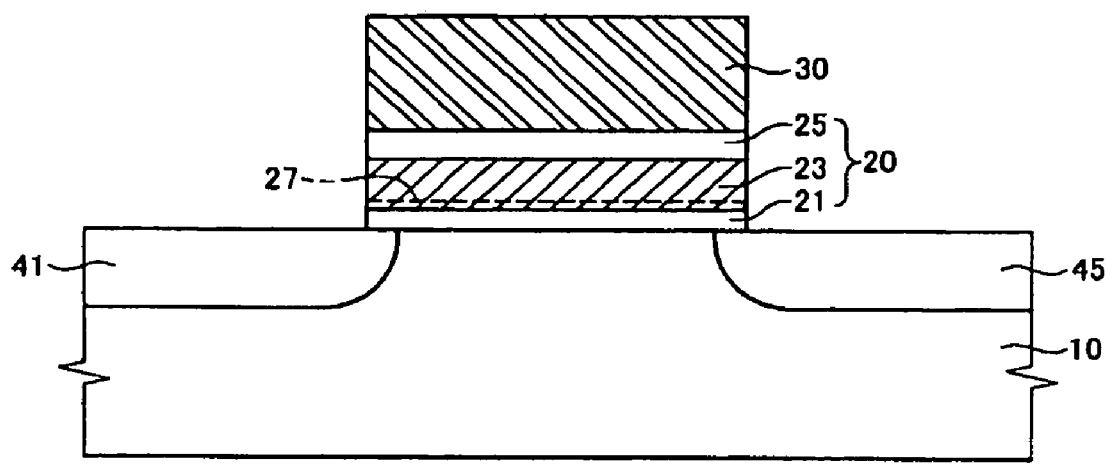
FIG. 1 is a cross-sectional view of a conventional SONOS device.
Figure 2:
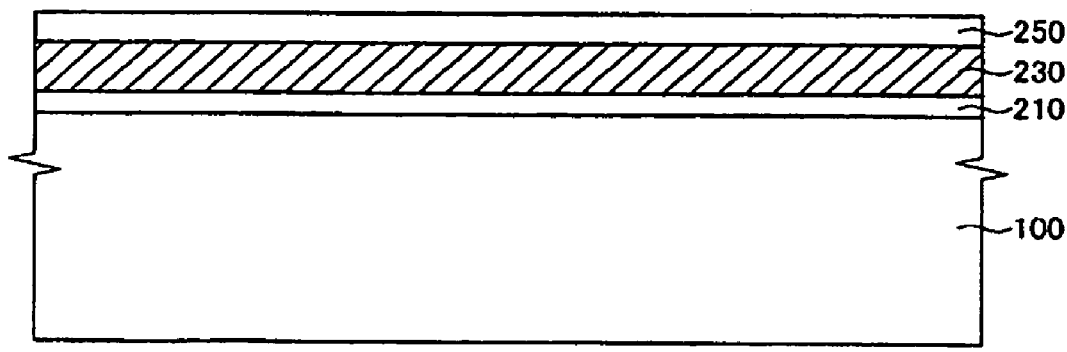
FIG. 2 to FIG. 5 are cross-sectional views of a SONOS device showing sequential stages of a method of manufacturing the same according to an exemplary embodiment of the present invention.

Referring to FIG. 2, an oxide layer to be used as a tunnel dielectric layer 210 is formed on a semiconductor substrate 100 (e.g., a silicon substrate) by a deposition method or by oxidization of the silicon substrate. A well, for example a p-well, may be formed in the silicon substrate prior to the formation of the tunnel dielectric layer. The tunnel dielectric layer 210 may be formed of a thickness of about 20 Å. A silicon nitride layer is formed as a charge trap layer 230 on the tunnel dielectric layer 210. A silicon oxide layer is then formed as the first charge blocking layer 250 on the silicon nitride layer.

Figure 3:
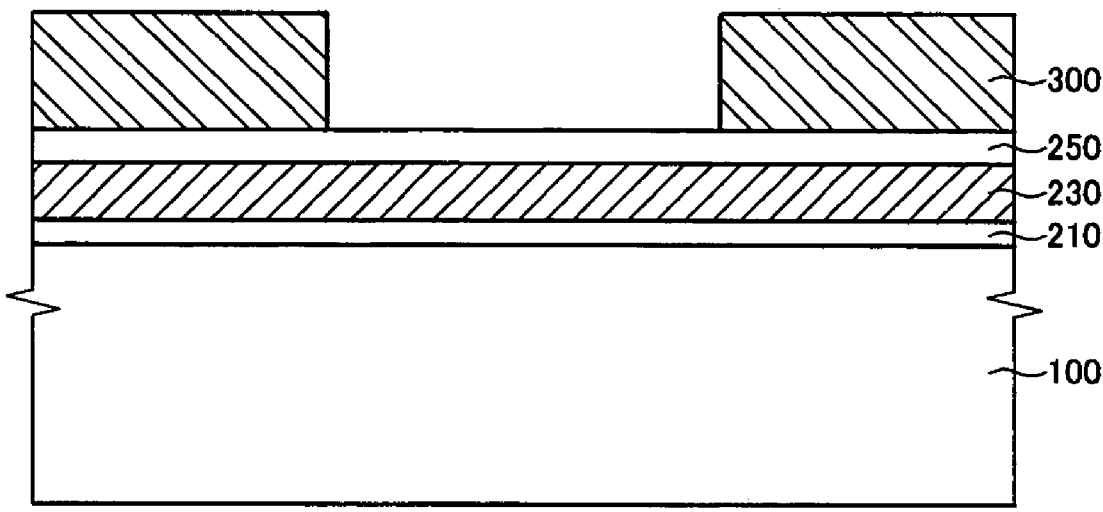

Referring to FIG. 3, a part of the first charge blocking layer 250 is selectively removed. A mask 300, which exposes a part of the first charge blocking layer 250, is formed on the first charge blocking layer 250. A photoresist pattern exposing the region of the first charge blocking layer 250 that overlaps the channel region may be formed on the first charge blocking layer 250 and used as the mask 300. The exposed region of the first charge blocking layer 250 is then selectively removed using the mask 300 as an etching mask.

Figure 4:
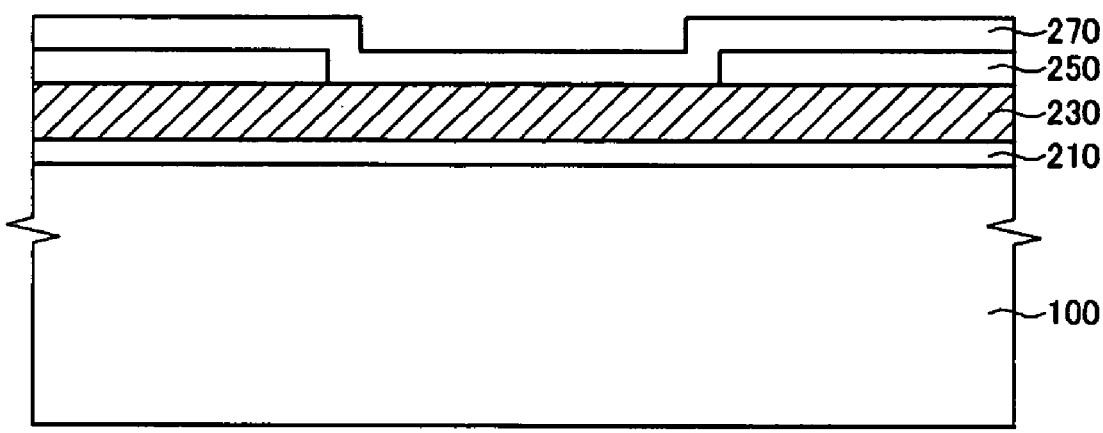

Referring to FIG. 4, after a part of the first charge blocking layer 250 is selectively removed by etching, a second charge blocking layer 270 is formed on the first charge blocking layer 250. The second charge blocking layer may be a silicon oxide layer or the like. Hence, the second charge blocking layer 270 has steps such that relatively thicker and thinner portions may be formed on the charge trap layer 230. In the step regions, the second charge blocking layer 270 is thicker.

Figure 5:
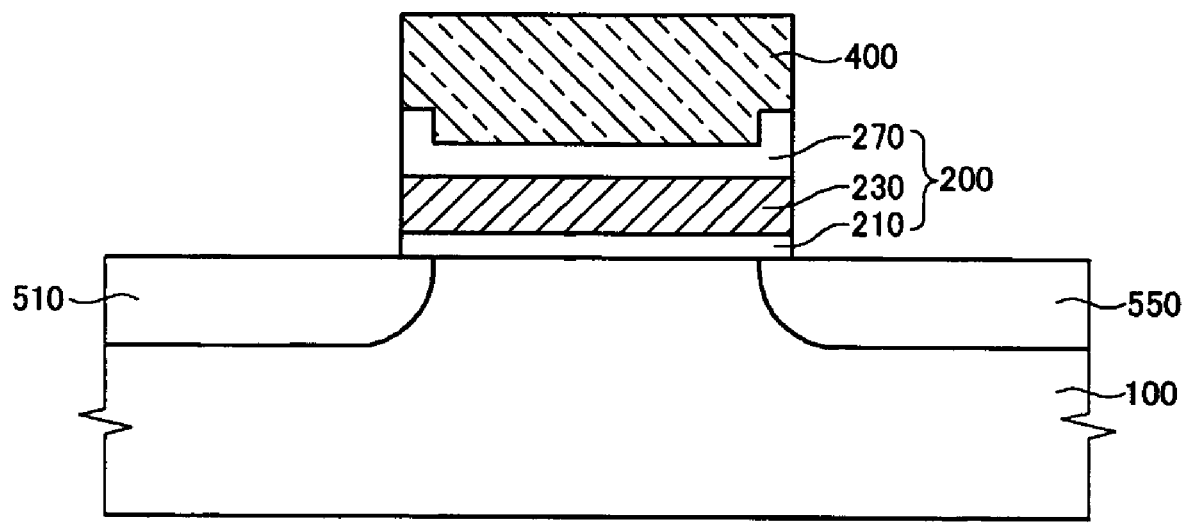

Referring to FIG. 5, a conductive polysilicon layer is formed on the second charge blocking layer 270, and then a gate electrode 400 is formed by a patterning process. In this case, the lower ONO structure 200 can be patterned separately or it can be patterned together with the gate electrode 400.

Subsequently, a source 510 and a drain 550 are formed by implanting impurities into the semiconductor substrate 100 adjacent to the gate electrode 400 by ion implantation. The source and drain 510 and 550 may also be formed to overlap a part of the terminal of the gate electrode 400. This can improve the operation of SONOS devices.

When the lower ONO structure 200 is patterned, the second charge blocking layer 270 is also patterned at the same time such that the relatively thicker region of the second charge blocking layer 270 can remain. Therefore, the thickness of the portion of the ONO structure 200 located at the region of the source and drain 510 and 550 overlapping the gate electrode 400 becomes relatively thicker in comparison with the portion of the ONO structure 200 located over the channel region.

This can significantly decrease the probability of charge trapping in the local regions when the SONOS device undergoes the write and erase operations at a high voltage, so it can dramatically decrease the amount of charge accumulated during the write and erase operations. Accumulation of the electric field from the accumulated charge also decreases, and thus, endurance characteristics (i.e., a characteristic of a repetition of the write and erase operations) can be improved. Therefore, the rupture phenomenon in the ONO structure 200 can be improved.

According to an embodiment of the present invention, the thickness of the charge blocking layer located over the region of the source and drain 510 and 550 overlapping the gate electrode 400 is thicker compared to that of the charge blocking layer 270 located over the channel region, so the probability of charge trapping over the source and draining region can be dramatically decreased when the SONOS device undergoes the write and erase operations at a high voltage.

It will be apparent to those skilled in the art that various modifications and variations can be made in the present invention without departing from the spirit or scope of the invention. Thus, it is intended that the present invention cover the modifications and variations of this invention provided they come within the scope of the appended claims.

What is claimed is:

1. A method for manufacturing a SONOS device, comprising:

forming a tunnel dielectric layer on a semiconductor substrate;

forming a charge trap layer on the tunnel dielectric layer;

forming a first charge blocking layer on the charge trap layer;

selectively etching a region of the first charge blocking layer overlapping a channel between a source region and a drain region;

forming a second charge blocking layer on the first charge blocking layer and the charge trap layer, the second blocking layer having locally thicker regions where steps are formed by the etching of the first charge blocking layer;

patterning the second charge blocking layer such that the locally thicker regions may be adjacent to or overlap the source and drain regions; and forming a gate on the second charge blocking layer.

2. The method of claim 1, wherein:
the tunnel dielectric layer comprises a silicon oxide layer;
the charge trap layer comprises a silicon nitride layer; and
the first and the second charge blocking layers comprise a silicon oxide layer.

3. The method of claim 1, wherein the selectively etching of the first charge blocking layer further comprises:

forming a mask exposing the region of the first charge blocking layer overlapping the channel; and
selectively etching the first charge blocking layer exposed by the mask such that the lower charge trap layer is exposed.

* * * * *